US009875672B2

United States Patent
Fujita

(10) Patent No.: US 9,875,672 B2
(45) Date of Patent: Jan. 23, 2018

(54) LIGHT-EMITTING DEVICE

(71) Applicants: PIONEER CORPORATION, Kawasaki-shi, Kanagawa (JP); TOHOKU PIONEER CORPORATION, Tendo-shi, Yamagata (JP)

(72) Inventor: Koji Fujita, Yonezawa (JP)

(73) Assignees: PIONEER CORPORATION, Kawasaki-Shi, Kanagawa (JP); TOHOKU PIONEER CORPORATION, Tendo-Shi, Yamagata (JP)

(*) Notice: Subject to any disclaimer, the term of this patent is extended or adjusted under 35 U.S.C. 154(b) by 0 days.

(21) Appl. No.: 15/033,591

(22) PCT Filed: Oct. 30, 2013

(86) PCT No.: PCT/JP2013/079435
§ 371 (c)(1),
(2) Date: Apr. 29, 2016

(87) PCT Pub. No.: WO2015/063893
PCT Pub. Date: May 7, 2013

(65) Prior Publication Data
US 2016/0284250 A1    Sep. 29, 2016

(51) Int. Cl.
*G09F 13/22* (2006.01)
*G09F 13/10* (2006.01)
(Continued)

(52) U.S. Cl.
CPC .............. *G09F 13/22* (2013.01); *G09F 13/10* (2013.01); *H01L 27/3239* (2013.01);
(Continued)

(58) Field of Classification Search
None
See application file for complete search history.

(56) References Cited

U.S. PATENT DOCUMENTS 6,181,062 B1 * 1/2001 Hiraishi .............. H01L 51/5281
                                                           313/112
7,825,579 B2    11/2010 Fukushima et al.
(Continued)

FOREIGN PATENT DOCUMENTS

JP    11-209884    8/1999
JP    11-297479    10/1999
(Continued)

OTHER PUBLICATIONS

International Search Report for PCT App No. PCT/JP2013/079435 dated Jul. 7, 2014, 4 pgs.

*Primary Examiner* — Lex Malsawma
(74) *Attorney, Agent, or Firm* — Procopio, Cory, Hargreaves & Savitch LLP

(57) ABSTRACT

A light shielding layer (200) is located between a plurality of light-emitting regions (101) when seen in a direction perpendicular to a substrate (100). The light shielding layer (200) includes a light reflection layer (202) and a light absorbing layer (204). The light absorbing layer (204) is located closer to the substrate (100) side in a thickness direction than the light reflection layer (202), and has a light reflectance lower than that of the light reflection layer (202). Further, when seen in the direction perpendicular to the substrate (100), an end of the light reflection layer (202) is located further inside of the light shielding layer (200) than an end of the light absorbing layer (204).

10 Claims, 14 Drawing Sheets

(51) Int. Cl.
 *H01L 27/32* (2006.01)
 *H01L 51/52* (2006.01)
(52) U.S. Cl.
 CPC .... *G09F 2013/222* (2013.01); *H01L 51/5281* (2013.01); *H01L 2251/5361* (2013.01)

(56) References Cited

U.S. PATENT DOCUMENTS

| | | | |
|---|---|---|---|
| 2008/0158852 A1 | 7/2008 | Fukushima et al. | |
| 2014/0133027 A1* | 5/2014 | Jang | G02B 5/3058 359/485.03 |
| 2016/0204383 A1* | 7/2016 | Okuyama | G09F 13/06 257/40 |

FOREIGN PATENT DOCUMENTS

| | | |
|---|---|---|
| JP | 11-345688 | 12/1999 |
| JP | 2005-122101 | 5/2005 |
| JP | 2006-208977 | 8/2006 |
| JP | 2008-129042 | 6/2008 |

\* cited by examiner (a)

(b)

(a)

(b)

(a)

(b)

LIGHT-EMITTING DEVICE

This is a National Stage entry of PCT/JP2013/079435, filed on Oct. 30, 2013, claiming benefit under 35 USC § 371.

TECHNICAL FIELD

The present invention relates to a light-emitting device.

BACKGROUND ART

One of the characteristics required in a light-emitting device that displays a predetermined pattern is visibility, for example, displaying an edge of a pattern to be sharp, or allowing only the displayed pattern to be recognized. Patent Document 1 discloses providing a light shielding layer on a light emission surface of a light-emitting device in order to improve visibility. Specifically, Patent Document 1 is a technique relating to a liquid crystal panel. The light shielding layer is provided on the surface of the liquid crystal panel on the light emission surface side. This light shielding layer is provided with a plurality of openings for forming pixels.

In addition, Patent Document 2 discloses providing a light-shielding mask in an optical device using an organic EL element. Specifically, this optical device is configured such that the organic EL element is formed on a transparent substrate, and a surface of the transparent substrate which has the organic EL element formed thereon is sealed by a sealing member. The light-shielding mask is formed in a region of the sealing member which overlaps the organic EL element.

RELATED DOCUMENT

Patent Document

[Patent Document 1] Japanese Unexamined Patent Application Publication No. 2005-122101
[Patent Document 2] Japanese Unexamined Patent Application Publication No. 2008-129042

SUMMARY OF THE INVENTION

The inventor has made studies to improve the visibility of light emitted from each light-emitting region in a light-emitting device including plural light-emitting regions. As one of the methods of improving the visibility of such a light-emitting device, there is a method of providing a light shielding layer in a region of a light emission surface of the light-emitting device which is located between plural light-emitting regions. However, a material used as the light shielding layer generally has a high reflectance of visible light in many cases. For this reason, when a portion of light from a certain light-emitting region proceeds obliquely toward the light shielding layer, the light is reflected by the light shielding layer. In addition, when the light-emitting region is formed by an organic EL element, one electrode of the organic EL element is formed by an electrode of a metal having a high reflectance, for example, aluminum. At least a portion of the reflected light is reflected by a light-emitting region (for example, electrode of a metal having a high reflectance described above) located next to a light-emitting region which is emitting light, and is emitted to the outside. When the light-emitting region located next thereto is a light-emitting region that does not originally emit light, the occurrence of such reflection causes even the light-emitting region which does not originally emit light to seem to emit light. In this case, the visibility of light emitted from each light-emitting region decreases.

An exemplary problem to be solved by the invention is to improve visibility in a light-emitting device that displays a predetermined pattern.

The invention according to claim 1 is a light-emitting device including: a substrate; plural light-emitting regions which are provided on a first surface side of the substrate; and a light shielding layer provided on a second surface side of the substrate and located between the plurality of light-emitting regions when seen in a direction perpendicular to the substrate, wherein the light shielding layer includes a first layer, and a second layer which is located closer to the substrate side in a thickness direction than the first layer, the second layer has a reflectance lower than that of the first layer, and an end of the first layer is located further inside of the light shielding layer than an end of the second layer when seen in the direction perpendicular to the substrate.

The invention according to claim 4 is a light-emitting device including: a substrate; plural light-emitting regions which are provided on a first surface side of the substrate; and a light shielding layer provided on a second surface side of the substrate and located between the plurality of light-emitting regions when seen in a direction perpendicular to the substrate, wherein the light shielding layer includes a first layer, a second layer which is located closer to the substrate side than the first layer, and a third layer that covers at least a portion of an end of the second layer, and the second layer and the third layer have a reflectance lower than that of the first layer.

BRIEF DESCRIPTION OF THE DRAWINGS

The above-mentioned objects, other objects, features and advantages will be made clearer from the preferred embodiment described below, and the following accompanying drawings.

DESCRIPTION OF EMBODIMENTS

Figure 1:
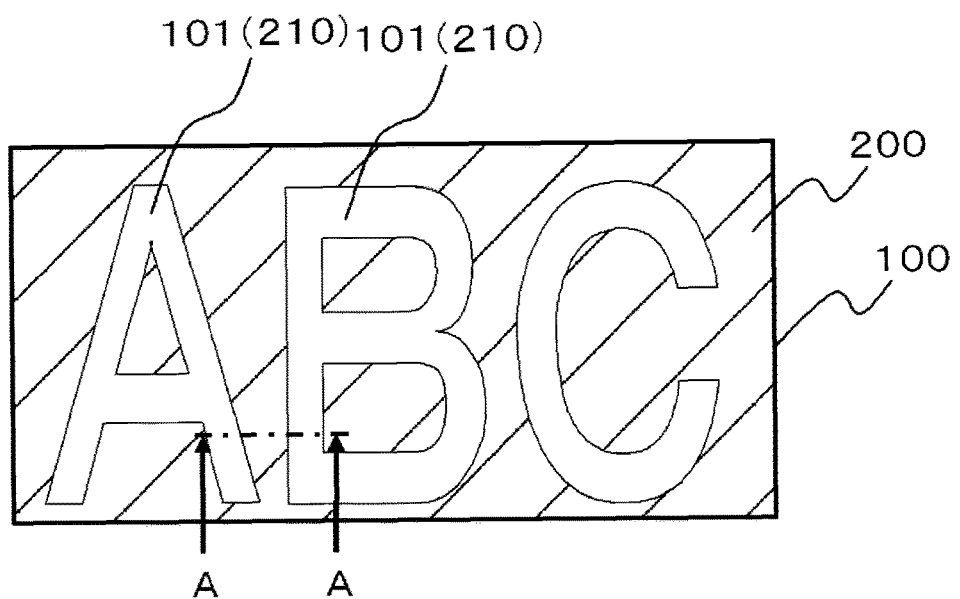
FIG. 1 is a plan view illustrating a light-emitting device according to a first embodiment.

Hereinafter, an embodiment of the present invention will be described with reference to the accompanying drawings. In all the drawings, like elements are referenced by like reference numerals and the descriptions thereof will not be repeated.

First Embodiment

Figure 2:
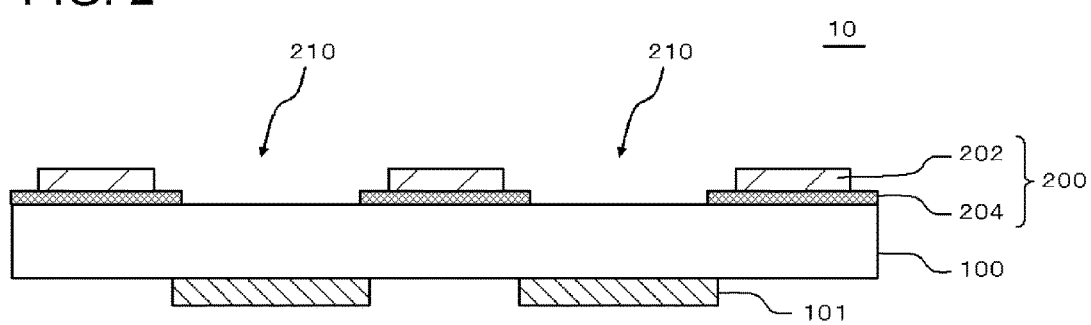
FIG. 2 is a cross-sectional view taken along line A-A of FIG. 1.

FIG. 1 is a plan view illustrating a light-emitting device 10 according to a first embodiment. FIG. 2 is a cross-sectional view taken along line A-A of FIG. 1. The light-emitting device 10 is, for example, used for displaying characters, symbols or the like in an optical device, and includes a substrate 100, a plurality of light-emitting regions 101, and a light shielding layer 200. The plurality of light-emitting regions 101 are provided on a first surface (for example, lower surface of FIG. 2) side of the substrate 100. The light shielding layer 200 is provided on a second surface side (for example, upper surface of FIG. 2) of the substrate 100. As shown in FIG. 2, the light shielding layer 200 is located between the plurality of light-emitting regions 101 when seen in a direction perpendicular to the substrate 100. The light shielding layer 200 includes a light reflection layer 202 (first layer) and a light absorbing layer 204 (second layer). The light absorbing layer 204 is located closer to the substrate 100 side in a thickness direction than the light reflection layer 202, and has a light reflectance lower than that of the light reflection layer 202. A preferred example of the light absorbing layer 204 is a layer that absorbs light, and does not include a transparent layer. Further, when seen in a direction perpendicular to the substrate 100, the end of the light reflection layer 202 is located further inside of the light shielding layer 200 than the end of the light absorbing layer 204. Hereinafter, a detailed description will be given.

The substrate 100 is formed of a material having light-transmissive properties with respect to light which is emitted by the light-emitting region 101. The substrate 100 may be a glass substrate, and may be a resin substrate. In addition, when the substrate 100 is thin to some extent, the substrate 100 has flexibility. The thickness of the substrate 100 is, for example, equal to or greater than 300 μm and equal to or less than 600 μm.

For example, each of light-emitting elements independent of each other is formed in each of the light-emitting regions 101. The light-emitting element is, for example, an organic EL element, but may be other spontaneous light-emitting elements such as an LED. The light-emitting region 101 has planar shapes (for example, character, numeral, and/or symbol) different from each other, for example, as shown in FIG. 1.

The light shielding layer 200 has a plurality of layers laminated therein. The light reflection layer 202 and the light absorbing layer 204 are included in the plurality of layers. In the example shown in FIG. 2, the light shielding layer 200 has a configuration in which the light absorbing layer 204 and the light reflection layer 202 are laminated in this order on the second surface side of the substrate 100. The light reflection layer 202 has a function of shielding visible light (for example, light which is emitted by the light-emitting region 101). The light reflection layer 202 is formed of, for example, a metal such as Cr, and the thickness thereof is, for example, equal to or greater than 50 nm and equal to or less than 200 nm. The light absorbing layer 204 is formed of a material having a lower reflectance of light emitted by the light-emitting region 101 than that of the light reflection layer 202. When the light reflection layer 202 is formed of a metal, the light absorbing layer 204 is formed of an oxide (for example, chromium oxide) of this metal. Meanwhile, the light absorbing layer 204 is formed to be thinner than the light reflection layer 202. The thickness of the light absorbing layer 204 is, for example, equal to or greater than 30 nm and equal to or less than 70 nm. The thickness of the light absorbing layer 204 is, for example, equal to or less than the thickness of the light reflection layer 202. However, the thickness of the light absorbing layer 204 may be equal to or greater than the thickness of the light reflection layer 202.

As described above, the light shielding layer 200 is located between the plurality of light-emitting regions 101 when seen in the direction perpendicular to the substrate 100. Specifically, the light shielding layer 200 includes a plurality of openings 210. The plurality of openings 210 overlap the light-emitting regions 101 different from each other when seen in the direction perpendicular to the substrate 100, and have the same shape as that of the overlapping light-emitting regions 101. For this reason, the light shielding layer 200 is provided, and thus the edge of a pattern shown by the light emission of the light-emitting region 101 becomes sharp. Therefore, the visibility of a pattern shown by the light-emitting device 10 is improved.

Further, when seen in a direction perpendicular to the substrate 100, the end of the light reflection layer 202 is located further inside of the light shielding layer 200 than the end of the light absorbing layer 204. In other words, the visible outline of the opening 210 is specified by the end of the light absorbing layer 204. The width of the light reflection layer 202 is smaller than the width of the light absorbing layer 204. For this reason, when seen from the light-emitting region 101, at least a portion of the end surface of the light reflection layer 202 is covered with the light absorbing layer 204. Meanwhile, the distance from the end of the light reflection layer 202 to the end of the light absorbing layer 204 is, for example, equal to or greater than 200 nm and equal to or less than 500 nm. In addition, in a case where the thickness of the light shielding layer 200 is set to t, the distance from the end of the light reflection layer 202 to the end of the light absorbing layer 204 is, for example, equal to or less than 3 t.

Meanwhile, when seen in the direction perpendicular to the substrate 100, each of the openings 210 may be slightly smaller than the light-emitting region 101. In this case, the edge of the opening 210 is located inside the light-emitting region 101. With this configuration, even when positional displacement occurs between the light-emitting region 101 and the light shielding layer 200, the edge of the light shielding layer 200 overlaps the light-emitting region 101, and the visibility of the light-emitting device 10 is not deteriorated. Meanwhile, the width of a portion in which the light shielding layer 200 and the light-emitting region 101 overlap each other is, for example, equal to or greater than 5 μm and equal to or less than 40 μm.

Figure 3:
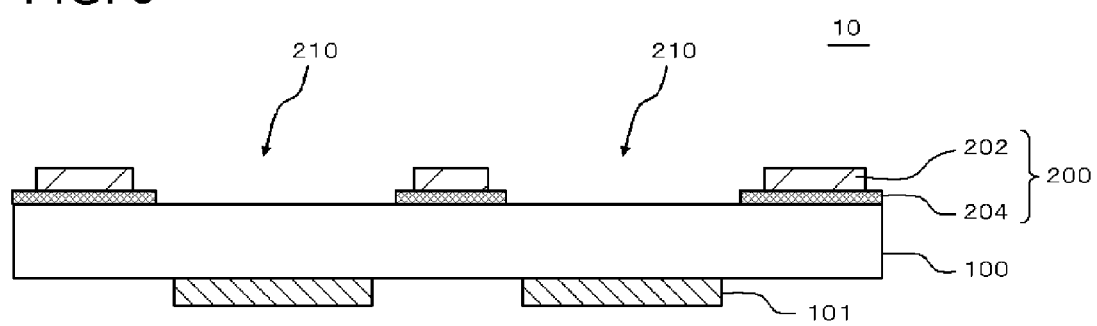
FIG. 3 is a diagram illustrating a modification example of FIG. 2.

On the contrary, as shown in FIG. 3, each of the openings 210 may be slightly larger than the light-emitting region 101. In this case, the distance from the end of the light shielding layer 200 to the end of the light-emitting region 101 is, for example, equal to or greater than 0.5 μm and equal to or less than 50 μm. In this case, even when the light-emitting device 10 is seen slightly obliquely, light from the light-emitting device 10 can be recognized.

Figure 4:
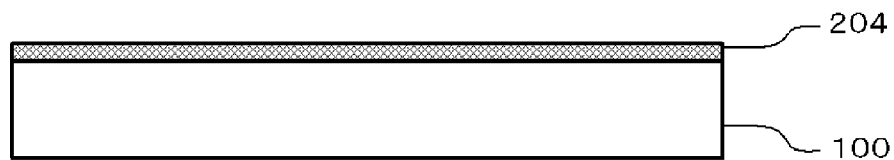
FIGS. 4(*a*) and 4(*b*) illustrate a cross-sectional view illustrating a method of forming a light shielding layer.
Figure 4:
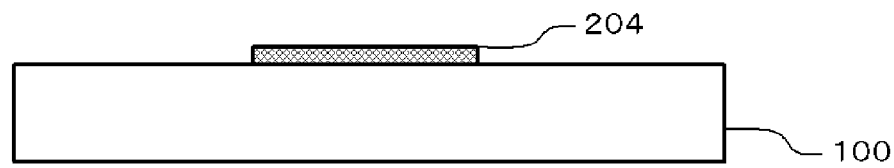
Figure 5:
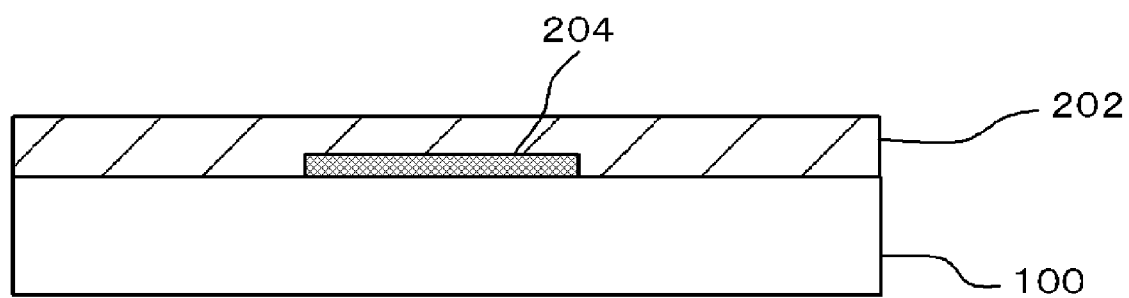
FIG. 5 is a cross-sectional view illustrating a method of forming the light shielding layer.

FIGS. 4 and 5 are cross-sectional views illustrating a method of forming the light shielding layer 200. Meanwhile, in the drawings, the light-emitting region 101 is not shown. However, before the light shielding layer 200 is formed, all of the light-emitting regions 101 do not need to be formed, and at least some of layers of the light-emitting regions 101 may be formed.

First, as shown in FIG. 4(a), the light absorbing layer 204 is formed on the substrate 100. The light absorbing layer 204 is formed using, for example, a vapor phase film formation method such as a sputtering method, a vapor deposition method, or a CVD method. Next, a mask pattern (for example, resist pattern which is not shown) is formed on the light absorbing layer 204, and the light absorbing layer 204 is etched through this mask pattern. The etching performed herein is, for example, wet etching, but may be dry etching. Thereby, an unnecessary portion of the light absorbing layer 204 is removed. Thereafter, as shown in FIG. 4(b), the mask pattern is removed.

Next, as shown in FIG. 5, the light reflection layer 202 is formed on the light absorbing layer 204 and on the substrate 100. The light absorbing layer 204 and the light reflection layer 202 are formed using, for example, a vapor phase film formation method such as a sputtering method, a vapor deposition method, or a CVD method.

Thereafter, a mask pattern (for example, resist pattern which is not shown) is formed on the light reflection layer 202, and the light reflection layer 202 is etched using this mask pattern as a mask. The etching performed herein is, for example, wet etching, but may be dry etching. Thereby, an unnecessary portion of the light reflection layer 202 is removed.

Figure 6:
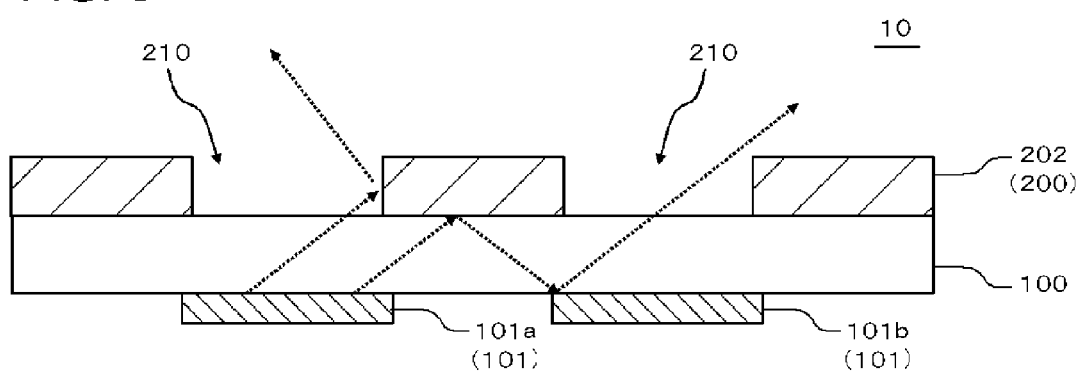
FIG. 6 is a cross-sectional view illustrating a configuration of a light-emitting device according to a comparative example.

FIG. 6 is a diagram illustrating a configuration of the light-emitting device 10 according to a comparative example, and corresponds to FIG. 2 in the embodiment. The light-emitting device 10 has the same configuration as that of the light-emitting device 10 according to the embodiment, except that the light shielding layer 200 does not include the light absorbing layer 204. A case is considered in which a certain light-emitting region 101a (left light-emitting region 101 in FIG. 6) emits light, and a light-emitting region 101b (right light-emitting region 101 in FIG. 6) located next thereto does not emit light. Generally, light emitted by a light-emitting element spreads out at an angle of a certain degree. For this reason, a portion of light emitted from the light-emitting region 101a is reflected by the light reflection layer 202, is further reflected by the light-emitting region 101b, and then is radiated to the outside of the light-emitting device 10. In this case, regardless of the light-emitting region 101b not emitting light, the light-emitting region 101b seems to emit light slightly. In this case, the visibility of the light-emitting device 10 decreases.

Figure 7:
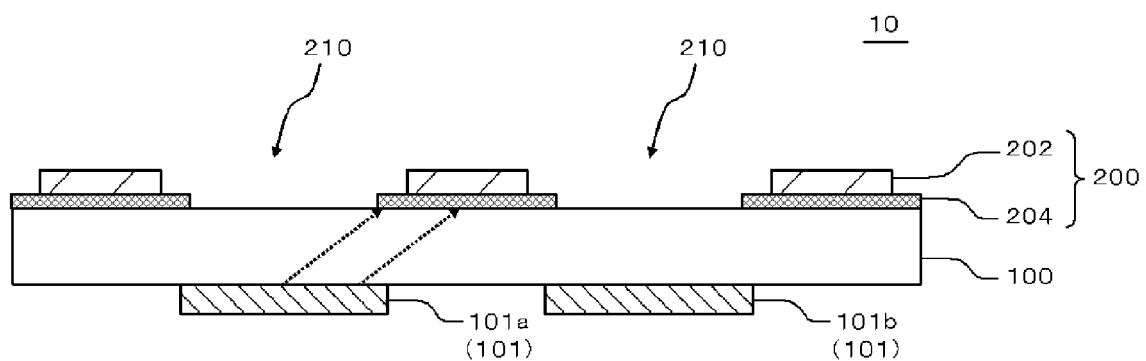
FIG. 7 is a cross-sectional view illustrating a function of a light absorbing layer in the light-emitting device according to the first embodiment.

On the other hand, in the present embodiment, the light absorbing layer 204 is formed on a surface of the light shielding layer 200 which faces the substrate 100. The light absorbing layer 204 has a reflectance of light lower than that of the light reflection layer 202. Therefore, as shown in FIG. 7, even when a portion of light emitted from the light-emitting region 101a is incident on the light shielding layer 200, the amount of light reflected toward the light-emitting region 101b from the light shielding layer 200 is reduced, or is substantially eliminated. Therefore, the visibility of the light-emitting device 10 is improved.

In addition, in the comparative example shown in FIG. 6, a portion of light emitted from the light-emitting region 101 is further reflected from the end surface of the light reflection layer 202. In this case, the edge of the light-emitting region 101 appears blurred, and as a result, the visibility of the light-emitting device 10 decreases.

On the other hand, in the present embodiment, since the end of the light reflection layer 202 is farther away from the light-emitting region 101 than the end of the light reflection layer 202 when seen from in a direction perpendicular to the substrate 100, at least a portion of the end surface of the light reflection layer 202 is covered with the light absorbing layer 204 when seen from the light-emitting region 101. Therefore, it is possible to prevent the light emitted from the light-emitting region 101 from being reflected from the end surface of the light reflection layer 202. Such an effect increases as the distance between the end of the light reflection layer 202 and the end of the light absorbing layer 204 becomes larger.

Second Embodiment

Figure 8:
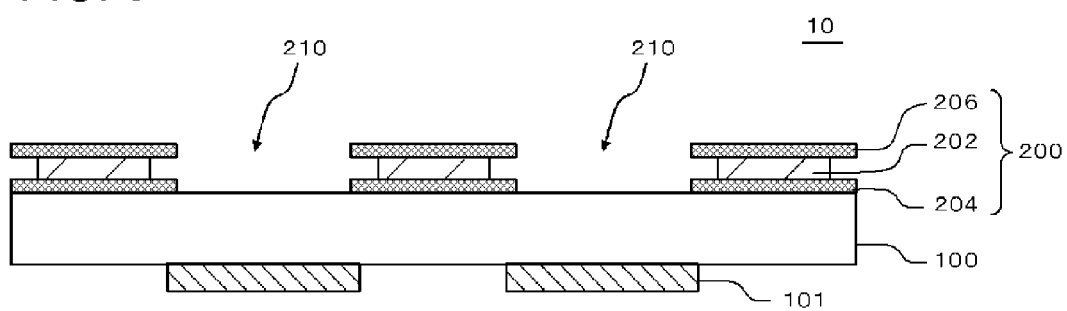
FIG. 8 is a cross-sectional view illustrating a light-emitting device according to a second embodiment.

FIG. 8 is a cross-sectional view illustrating a configuration of a light-emitting device 10 according to a second embodiment, and corresponds to FIG. 2 in the first embodiment. The light-emitting device 10 according to the present embodiment has the same configuration as that of the light-emitting device 10 according to the first embodiment, except that the light shielding layer 200 includes a light absorbing layer 206 (third layer).

The light absorbing layer 206 is located on a side of the light reflection layer 202 opposite to the substrate 100 side with the light reflection layer 202 (first layer) interposed therebetween. In other words, the light shielding layer 200 has a configuration in which the light absorbing layer 204, the light reflection layer 202, and the light absorbing layer 206 are laminated in this order. The light absorbing layer 206 has a reflectance lower than that of the light reflection layer 202. When seen from a direction perpendicular to the substrate 100, the end of the light reflection layer 202 is located further inside of the light shielding layer 200 than the end of the light absorbing layer 206. The light absorbing layer 206 is formed of a material similar to that of the light absorbing layer 204. For example, in a case where the light reflection layer 202 is formed of a metal, the light absorbing layer 204 is formed of an oxide (for example, chromium oxide) of this metal. Meanwhile, the light absorbing layer 206 is formed to be thinner than the light reflection layer 202. The thickness of the light absorbing layer 206 is, for example, equal to or less than the thickness of the light reflection layer 202. However, the thickness of the light absorbing layer 206 may be equal to or greater than the thickness of the light reflection layer 202.

Figure 9:
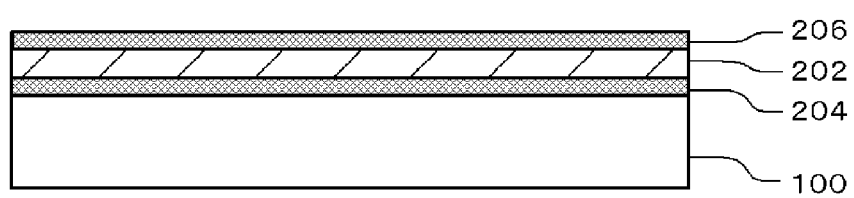
FIGS. 9(*a*) and 9(*b*) illustrate a cross-sectional view illustrating a method of forming a light shielding layer according to the second embodiment.
Figure 9:
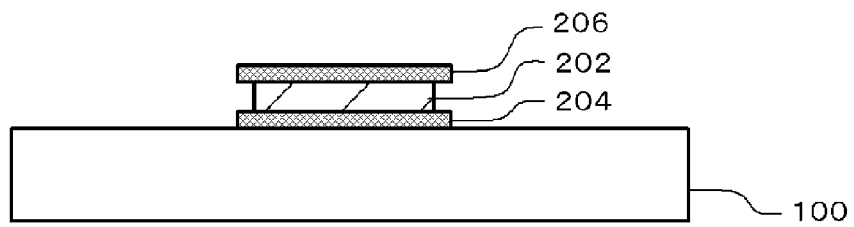

FIG. 9 is a cross-sectional view illustrating a method of manufacturing the light shielding layer 200 according to the present embodiment. First, as shown in FIG. 9(a), the light absorbing layer 204, the light reflection layer 202, and the light absorbing layer 206 are formed on the substrate 100 in this order. The light absorbing layer 204, the light reflection layer 202, and the light absorbing layer 206 are formed using, for example, a vapor phase film formation method such as a sputtering method, a vapor deposition method, or a CVD method. Meanwhile, in a case where the light absorbing layers 204 and 206 are formed of an oxide of a metal for forming the light reflection layer 202, it is preferable that the light reflection layer 202 and the light absorbing layers 204 and 206 are formed in the same processing chamber. In this case, first, film formation is performed while an oxidizing agent (for example, oxygen gas) is introduced into the processing chamber, then, the introduction of the oxidizing agent is stopped while film formation is continued. Thereafter, the introduction of the oxidizing agent is restarted, thereby allowing the light absorbing layer 204, the light reflection layer 202, and the light absorbing layer 206 to be continuously formed in this order.

Next, as shown in FIG. 9(*b*), a mask pattern (for example, resist pattern which is not shown) is formed on the light absorbing layer 206, and the light absorbing layer 206, the light reflection layer 202, and the light absorbing layer 204 are etched through this mask pattern. The etching performed herein is, for example, wet etching, but may be dry etching. Thereby, an unnecessary portion of the light absorbing layer 204 is removed. Etching conditions in this case are set so that the etching rate of the light reflection layer 202 becomes faster than the etching rate of the light absorbing layer 204 and the light absorbing layer 206. Thereby, the end of the light reflection layer 202 is located further inside of the light shielding layer 200 than the ends of the light absorbing layer 204 and the light absorbing layer 206. Thereafter, the mask pattern is removed. According to such a method, when seen in a direction perpendicular to the substrate as shown in FIG. 8, the end of the light reflection layer 202 (first layer) is located further inside of the light shielding layer 200 than the ends of the light absorbing layer 204 (second layer) and the light absorbing layer 206 (third layer).

In the present embodiment, as is the case with the first embodiment, it is thus possible to prevent the light emitted from the light-emitting region 101 from being reflected from the end surface of the light reflection layer 202. Therefore, the visibility of the light-emitting device 10 is improved.

In addition, since the light absorbing layer 206 is formed on the upper surface of the light reflection layer 202, it is possible to prevent light incident on the light-emitting device 10 from outside of the light-emitting device 10 from being reflected by the light reflection layer 202. Therefore, the visibility of the light-emitting device 10 is further improved.

Figure 10:
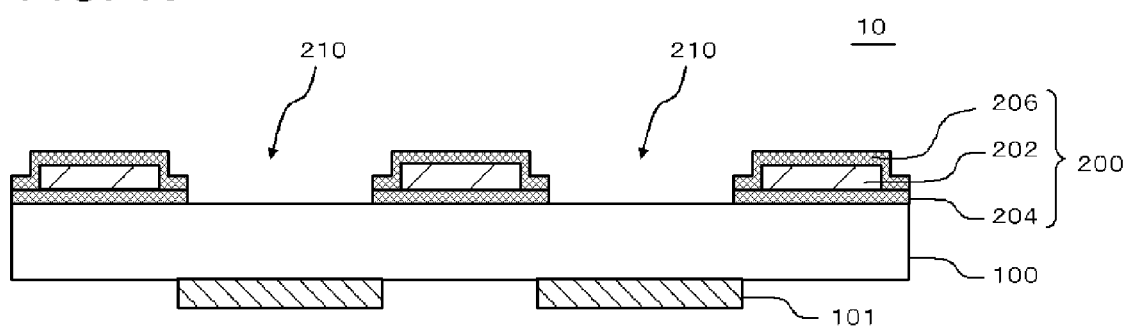
FIG. 10 is a diagram illustrating a modification example of FIG. 8.

Meanwhile, as shown in FIG. 10, the end of the light absorbing layer 206 may be deformed due to its own weight, and thus may become located on the light absorbing layer 204. In this case, at least a portion of the end of the light reflection layer 202 is covered with the light absorbing layer 206. In this case, it is possible to further prevent the light emitted from the light-emitting region 101 from being reflected from the end surface of the light reflection layer 202. Particularly, as shown in the drawing, in a case where a portion of the light absorbing layer 206 is located on the light absorbing layer 204, since the entirety of the end of the light reflection layer 202 is covered with the light absorbing layer 206, it is possible to further prevent the light emitted from the light-emitting region 101 from being reflected from the end surface of the light reflection layer 202.

Meanwhile, in view of preventing the light from the light-emitting region 101 from being reflected by the end surface of the light absorbing layer 206, the light absorbing layer 206 may be formed only on the lateral side of the light reflection layer 202.

EXAMPLE

Figure 11:
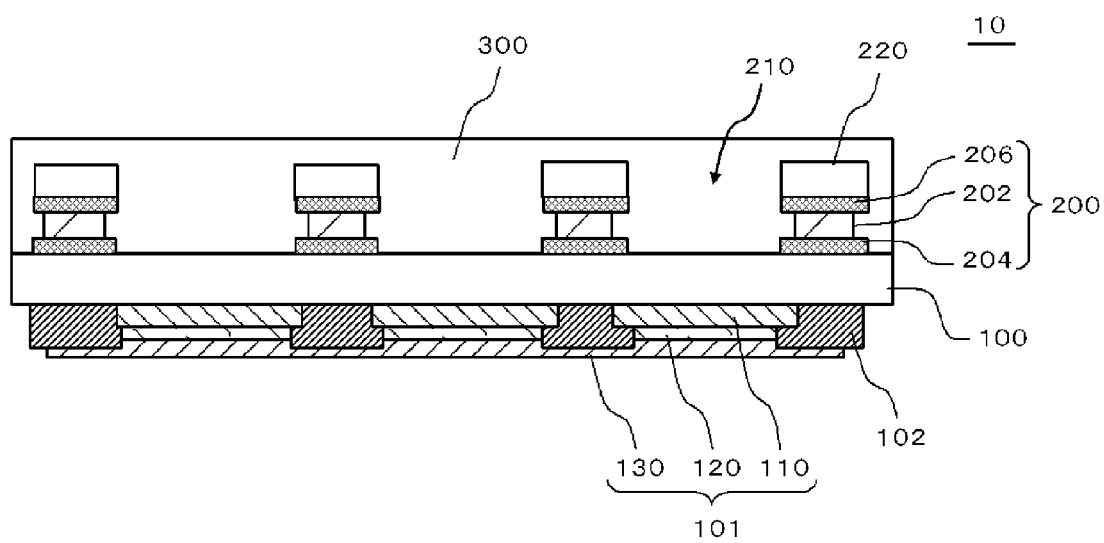
FIG. 11 is a cross-sectional view illustrating a configuration of a light-emitting device according an example.

FIG. 11 is a cross-sectional view illustrating a configuration of a light-emitting device 10 according to an example. The light-emitting device 10 according to the present example has the same configuration as that of the light-emitting device 10 shown in the second embodiment, except for the following points.

First, the light-emitting region 101 is formed of an organic EL element. Specifically, the light-emitting region 101 includes a first electrode 110, an organic layer 120, and a second electrode 130. Meanwhile, other layers may be formed between the respective layers.

The first electrode 110 is formed of a light-transmitting conductive material, for example, an inorganic material such as an indium thin oxide (ITO) or an indium zinc oxide (IZO), or a conductive polymer such as a polythiophene derivative. The second electrode 130 is formed of a material that reflects light, for example, a metal such as an Al electrode.

The organic layer 120 is, for example, a layer in which a hole transport layer, a light-emitting layer, and an electron transport layer are laminated. The hole transport layer is in contact with the first electrode 110, and the electron transport layer is in contact with the second electrode 130. In this manner, the organic layer 120 is interposed between the first electrode 110 and the second electrode 130. A material of the organic layer 120, for example, a material of the light-emitting layer, is selected, thereby allowing the color of light emitted by the light-emitting region 101 to be set to a desired color.

Meanwhile, a hole injection layer may be formed between the first electrode 110 and the hole transport layer, and an electron injection layer may be formed between the second electrode 130 and the electron transport layer. In addition, not all of the layers mentioned above are required. For example, when the recombination of holes and electrons occur within the electron transport layer, the electron transport layer also has a function of the light-emitting layer, and thus the light-emitting layer is not required. In addition, at least one of the first electrode 110, the hole injection layer, the hole transport layer, the electron transport layer, the electron injection layer, and the second electrode 130 may be formed using a coating method such as an ink jet method. In addition, an electron injection layer formed of an inorganic material such as LiF may be provided between the organic layer 120 and the second electrode 130.

When seen from the direction perpendicular to the substrate 100, the second electrode 130 is formed between the light-emitting regions 101 adjacent to each other. That is, the first electrode 110 and the organic layer 120 are patterned for each of the light-emitting regions 101, but the second electrode 130 serves as a common electrode between a plurality of first electrodes 110.

Meanwhile, an insulating layer 102 is formed between the light-emitting regions 101 adjacent to each other. Specifically, the first electrode 110 and the organic layer 120 are formed between adjacent insulating layers 102. A portion of the organic layer 120 may protrude onto the insulating layer 102. The second electrode 130 is continuously formed on the organic layer 120 and the insulating layer 102. The insulating layer 102 is formed of a photosensitive resin such as a polyimide-based resin, and is formed in a desired pattern by exposure and development. As the insulating layer 102, for example, a positive-type photosensitive resin is used. Meanwhile, the insulating layer 102 may be resins other than a polyimide-based resin, for example, an epoxy-based resin or an acrylic-based resin.

After the insulating layer 102 is formed, the organic layer 120 and the second electrode 130 are formed in this order.

A polarization layer 300 is formed on a surface of the substrate 100 which has the light shielding layer 200 formed thereon. The polarization layer 300 covers the light shielding layer 200. The polarization layer 300 is provided in order to prevent external light incident on the light-emitting region from being reflected by the second electrode 130, or to prevent the external light from being reflected from the upper surface of the light shielding layer 200. That is, it is possible to improve the quality of the appearance of the light-emitting device 10 when the light-emitting device 10 does not emit light. When the polarization layer 300 is formed on the light shielding layer 200, the thickness of the light shielding layer 200 may be set to be equal to or less than 200 nm. When the thickness of the light shielding layer 200 becomes larger, air bubbles are drawn in during the attachment of the polarization layer 300 to the substrate 100, and thus the quality of appearance becomes deteriorated.

In addition, a coating film 220 is formed on a surface of the light reflection layer 202 of the light shielding layer 200 which is opposite to the light absorbing layer 204. The coating film 220 is formed of, for example, a resin such as a resist, or an inorganic material such as a silicon oxide. In an example shown in the drawing, the coating film 220 is formed on the light absorbing layer 206. In a process of manufacturing the light-emitting device 10 described later, after the light shielding layer 200 is formed on the second surface of the substrate 100, the substrate 100 may be transported with the second surface side facing downward. In this case, the coating film 220 is provided in order not to damage the light shielding layer 200.

Figure 12:
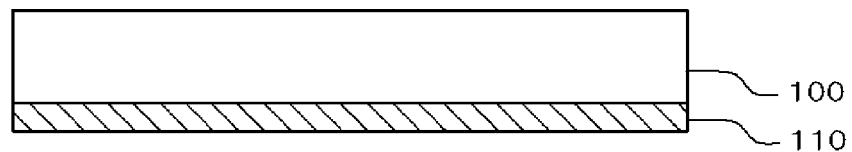
FIGS. 12(*a*) and 12(*b*) illustrate a diagram illustrating a method of manufacturing the light-emitting device according to the example.
Figure 12:
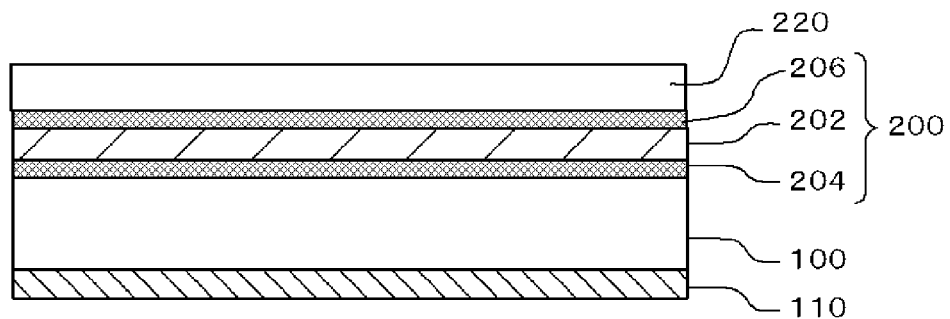
Figure 13:
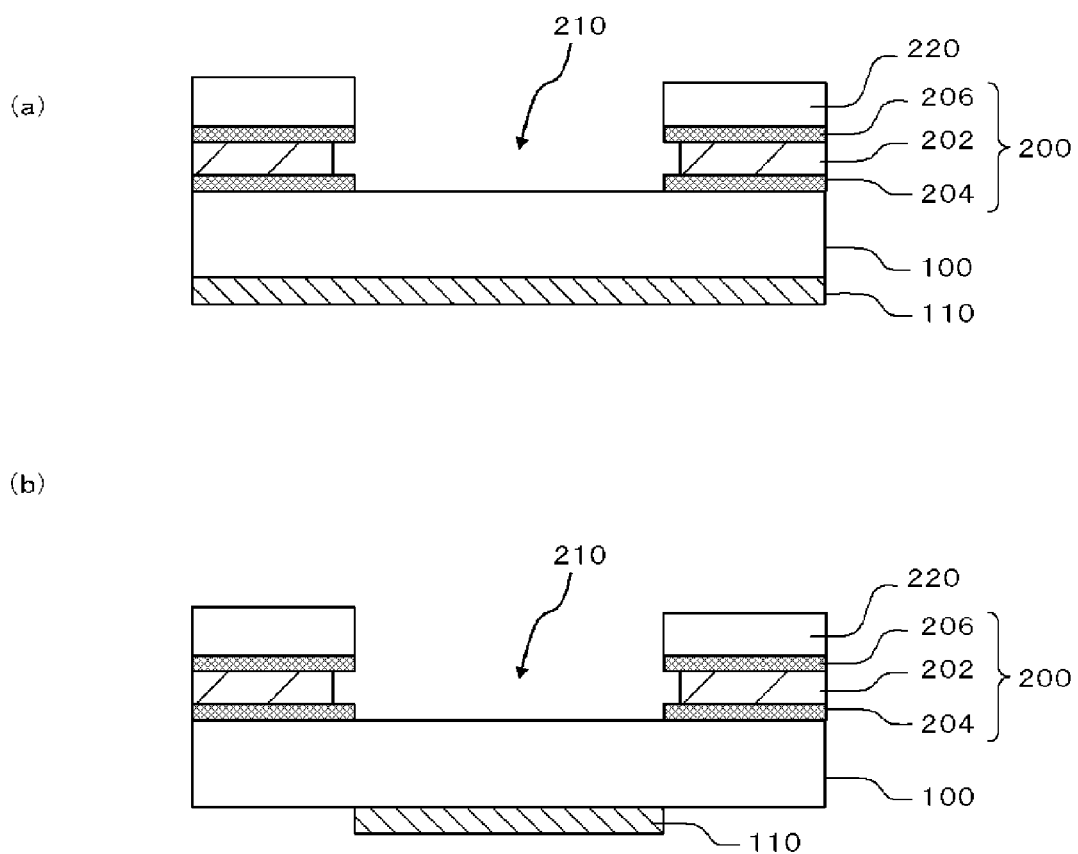
FIGS. 13(a) and 13(b) illustrate a diagram illustrating a method of manufacturing the light-emitting device according to the example.
Figure 14:
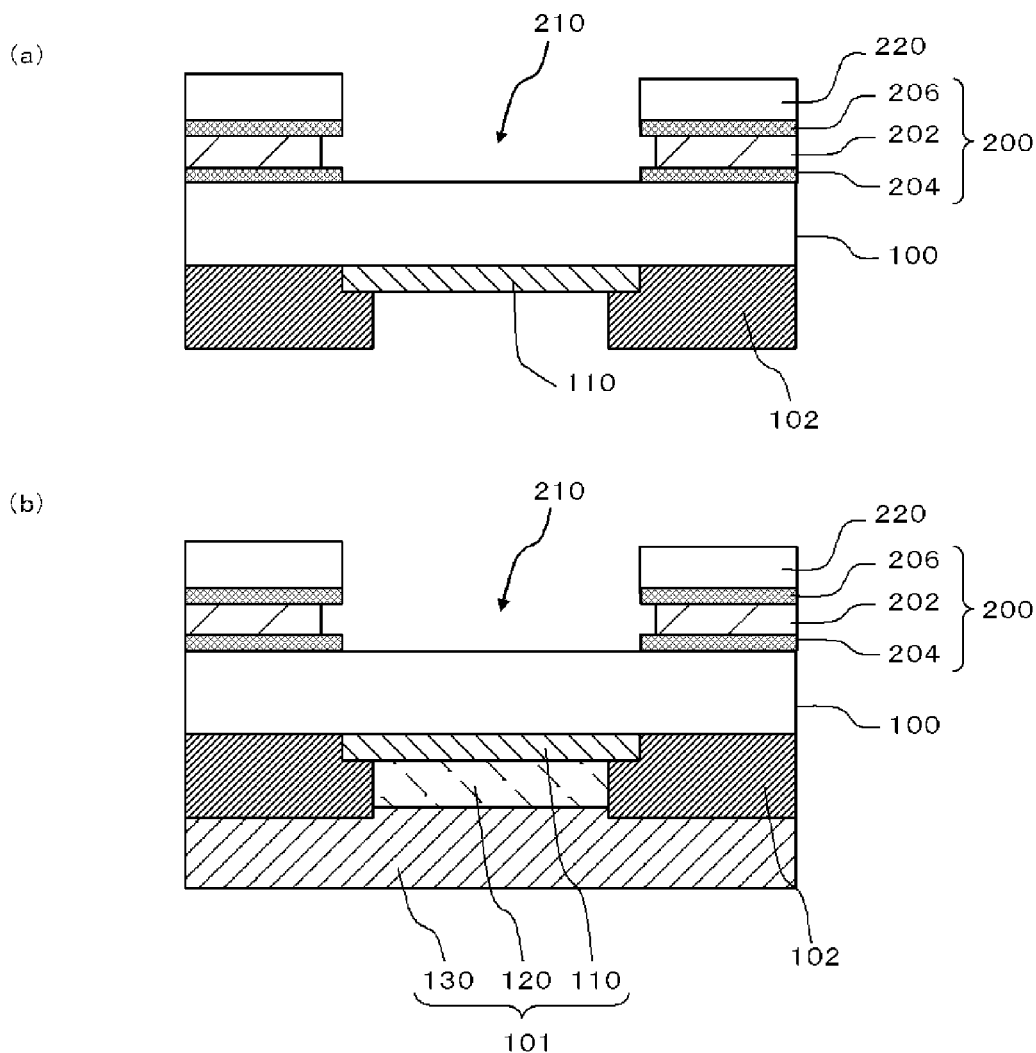
FIGS. 14(a) and 14(b) illustrate is a diagram illustrating a method of manufacturing the light-emitting device according to the example.

FIGS. 12 to 14 are diagrams illustrating a method of manufacturing the light-emitting device 10 in the present example. First, as shown in FIG. 12(a), the first electrode 110 is formed on a surface of the substrate 100 which has the light-emitting region 101 formed thereon. At this stage, the first electrode 110 is not patterned. Meanwhile, the first electrode 110 is formed using, for example, a vapor deposition method, a sputtering method, or a CVD method.

Next, as shown in FIG. 12(b), the light absorbing layer 204, the light reflection layer 202, and the light absorbing layer 206 are formed, in this order, on the surface of the substrate 100 which is opposite to a surface having the first electrode 110 formed thereon. Next, the coating film 220 is formed on the light absorbing layer 206. The coating film 220 is formed using, for example, a coating method.

Next, as shown in FIG. 13(a), the light shielding layer 200 and the coating film 220 are patterned, and the opening 210 is formed. In this case, the end of the light reflection layer 202 is located further inside of the light reflection layer 202 than the ends of the light absorbing layer 204 and the light absorbing layer 206, as described in the second embodiment.

Next, as shown in FIG. 13(b), the first electrode 110 is patterned. This process is performed, for example, by forming a resist pattern on the first electrode 110, and etching the first electrode 110 using the resist pattern as a mask. In addition, at this time, since the light shielding layer 200 becomes the transporting surface, the light shielding layer 200 has a tendency to be damaged. However, in the present example, the coating film 220 is provided on the surface of the light shielding layer 200 which is opposite to the substrate 100. For this reason, it is possible to suppress damage to the light shielding layer 200.

Next, as shown in FIG. 14(a), the insulating layer 102 is formed, and the insulating layer 102 is patterned. When the insulating layer 102 is formed of a photosensitive material, the insulating layer 102 is patterned by exposure and development.

Next, as shown in FIG. 14(b), the organic layer 120 is formed. Each layer constituting the organic layer 120 may be formed using a vapor deposition method, and may be formed using a coating method such as spray coating, dispenser coating, ink jet, or printing. In addition, at least one of a plurality of layers constituting the organic layer 120 may be formed by methods different from those with which other layers are formed.

Next, the second electrode 130 is formed on the organic layer 120. The second electrode 130 is formed using, for example, a vapor deposition method, a sputtering method, or a CVD method. Thereafter, the polarization layer 300 is formed.

In the present example, as is the case with the embodiment, it is also possible to prevent the visibility of the light-emitting device 10 from decreasing.

In addition, in the present example, when seen in the direction perpendicular to the substrate 100, the second electrode 130 is also formed in a region located between the light-emitting regions 101. Therefore, when the light reflection layer 202 reflects light from the organic layer 120, there is a high probability of this reflected light being reflected by the second electrode 130. In this case, the visibility of the light-emitting device 10 particularly has a tendency to decrease. On the other hand, in the present example, the light absorbing layer 204 is formed on a surface of the light reflection layer 202 which faces the substrate 100. Therefore, even when the second electrode 130 is formed between adjacent light-emitting regions 101, it is possible to prevent the visibility of the light-emitting device 10 from decreasing.

Meanwhile, in the present example, the configuration of the light shielding layer 200 may be the same configuration as that of the first embodiment.

As described above, although the embodiment and examples have been set forth with reference to the accompanying drawings, they are merely illustrative of the present invention, and various configurations other than those stated above can be adopted.

The invention claimed is:

1. A light-emitting device comprising:
   a substrate;
   a plurality of light-emitting regions which are provided on a first surface side of the substrate; and
   a light shielding layer, provided on a second surface side of the substrate, which is located between the plurality of light-emitting regions when seen in a direction perpendicular to the substrate,
   wherein the light shielding layer includes a first layer, and a second layer which is located closer to the substrate side in a thickness direction than the first layer,
   the second layer has a reflectance lower than that of the first layer, and
   the first layer has a width less than a width of the second layer when seen in the direction perpendicular to the substrate, and at least one edge of the second layer extends beyond at least one edge of the first layer when seen in the direction perpendicular to the substrate, and the first layer and the second layer are on a common side of the substrate with respect to each other.

2. The light-emitting device according to claim 1, further comprising a third layer which is located on a side of the first layer opposite to the substrate side with the first layer interposed therebetween,
   wherein the third layer has a reflectance lower than that of the first layer, and
   the end of the first layer is located further inside of the light shielding layer than an end of the third layer when seen in the direction perpendicular to the substrate.

3. The light-emitting device according to claim 2, wherein the first layer is formed of a metal, and the second layer is formed of an oxide of the metal.

4. The light-emitting device according to claim 3, wherein each of the plurality of light-emitting regions includes:
- a first electrode;
- a second electrode which is provided on a side of the first electrode opposite to the substrate side via the first electrode; and
- an organic layer which is located between the first electrode and the second electrode.

5. The light-emitting device according to claim 4, wherein when seen in the direction perpendicular to the substrate, the second electrode is also formed in a region located between the plurality of light-emitting regions.

6. A light-emitting device comprising:
- a substrate;
- a plurality of light-emitting regions which are provided on a first surface side of the substrate; and
- a light shielding layer, provided on a second surface side of the substrate, which is located between the plurality of light-emitting regions when seen in a direction perpendicular to the substrate, wherein the light shielding layer includes a first layer, a second layer which is located closer to the substrate side than the first layer, and a third layer that covers at least a portion of an end of the second layer, and wherein the second layer and the third layer have a reflectance lower than that of the first layer, and the third layer does not overlap the plurality of light-emitting regions.

7. The light-emitting device according to claim 6, wherein a portion of the third layer is located over the first layer.

8. The light-emitting device according to claim 7, wherein the first layer is interposed between the second layer and the third layer, and an end of the first layer is located further inside of the light shielding layer than the end of the second layer and an end of the third layer when seen in the direction perpendicular to the substrate.

9. The light-emitting device according to claim 8, wherein the first layer is formed of a metal, and the second layer and the third layer are formed of an oxide of the metal.

10. The light-emitting device according to claim 6, wherein ones of the third layer are separated from each other by an opening.

* * * * *